United States Patent
Knaack et al.

(10) Patent No.: US 6,510,486 B1
(45) Date of Patent: *Jan. 21, 2003

(54) CLOCKING SCHEME FOR INDEPENDENTLY READING AND WRITING MULTIPLE WIDTH WORDS FROM A MEMORY ARRAY

(75) Inventors: Roland T. Knaack, Starkville, MS (US); Andrew L. Hawkins, Starkville, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/621,487

(22) Filed: Mar. 25, 1996

(51) Int. Cl.[7] .............................................. G06F 12/00
(52) U.S. Cl. ........................ 711/5; 711/171; 713/500; 713/600; 365/189.05; 365/230.03
(58) Field of Search ...................... 365/230.03, 230.05, 365/230.06, 189.02, 189.05, 189.12, 189.06, 233, 189.01; 711/5, 171, 219, 212; 710/66; 713/400, 500, 501, 600

(56) References Cited

U.S. PATENT DOCUMENTS

| | | | |
|---|---|---|---|
| 4,467,443 A | * 8/1984 | Shima | 395/416 |
| 4,802,122 A | 1/1989 | Auvinen et al. | 365/154 |
| 4,839,866 A | 6/1989 | Ward et al. | 365/221 |
| 4,864,543 A | 9/1989 | Ward et al. | 365/221 |
| 4,875,196 A | 10/1989 | Spaderna et al. | 365/238 |
| 4,891,788 A | 1/1990 | Kreifels | 365/49 |
| 4,985,867 A | 1/1991 | Ishii et al. | 365/221 |
| 5,084,837 A | 1/1992 | Matsumato et al. | 395/250 |
| 5,088,061 A | 2/1992 | Golnabi et al. | 365/189.01 |
| 5,220,529 A | 6/1993 | Kohiyama et al. | 365/189.01 |
| 5,222,047 A | * 6/1993 | Matsuda et al. | 365/230.03 |
| 5,228,002 A | 7/1993 | Huang | 365/221 |
| 5,262,996 A | 11/1993 | Shiue | 362/221 |
| 5,265,063 A | 11/1993 | Kogure | 365/233 |
| 5,305,253 A | 4/1994 | Ward | 365/73 |
| 5,311,475 A | 5/1994 | Huang | 365/221 |
| 5,317,756 A | 5/1994 | Komatsu et al. | 395/800 |
| 5,333,294 A | * 7/1994 | Schnell | 395/846 |
| 5,345,419 A | 9/1994 | Fenstermaker et al. | 365/189.04 |

(List continued on next page.)

FOREIGN PATENT DOCUMENTS

| | | |
|---|---|---|
| JP | 0113996 | 8/1989 |
| JP | 0676559 | 6/1994 |

*Primary Examiner*—Matthew Kim
*Assistant Examiner*—Denise Tran
(74) *Attorney, Agent, or Firm*—Christopher P. Maiorana, P.C.

(57) ABSTRACT

The present invention provides a circuit for writing a particular sized data word from a common input to a number of individual memory cells in a memory array and reading a particular sized data word from the individual memory cells to a common output. The size of the word written to the memory cells can be larger, smaller or the same as the size of the word read from the memory array. The present invention uses a multi-bit write counter to distribute a write timing signal to a number of multiplexer blocks and a multi-bit read counter to distribute a read timing signal to a number of sense amplifier blocks. Each of the multiplexer blocks receives both a data input signal from the common input and the write timing signal continuously when the circuit is in operation. Each of the sense amplifier blocks receives data from the memory array and a read timing signal at all times. When a particular read timing signal is present at a sense amplifier, the output signal containing a fixed width data word is received from one or more of the corresponding memory arrays and is presented to the common output. The present invention reduces the number of internal signal lines necessary to implement the control function and allows for easy modification to both read and write multiple width words to and from the memory array.

15 Claims, 3 Drawing Sheets

U.S. PATENT DOCUMENTS

| | | | |
|---|---|---|---|
| 5,367,486 A | 11/1994 | Mori et al. | 365/189.05 |
| 5,375,092 A | 12/1994 | Taniguchi et al. | 365/221 |
| 5,404,332 A | 4/1995 | Sato et al. | 365/201 |
| 5,406,273 A | 4/1995 | Nishida et al. | 340/825.51 |
| 5,406,554 A | 4/1995 | Parry | 370/58.1 |
| 5,412,611 A | 5/1995 | Hattori et al. | 365/211 |
| 5,426,612 A | 6/1995 | Ichige et al. | 365/220 |
| 5,467,319 A | 11/1995 | Nusinov et al. | 365/231 |
| 5,490,257 A | 2/1996 | Hoberman et al. | 395/427 |
| 5,506,809 A | 4/1996 | Csoppenszky et al. | 365/221 |
| 5,506,815 A | 4/1996 | Hsieh et al. | 365/230.03 |
| 5,513,318 A | 4/1996 | van de Goor et al. | 395/185.01 |
| 5,521,876 A * | 5/1996 | Hattori | 365/221 |
| 5,528,553 A | 6/1996 | Saxena | 365/230.01 |
| 5,546,347 A | 8/1996 | Ko et al. | 365/221 |

* cited by examiner

CLOCKING SCHEME FOR INDEPENDENTLY READING AND WRITING MULTIPLE WIDTH WORDS FROM A MEMORY ARRAY

FIELD OF THE INVENTION

The present invention relates to FIFO buffers generally and, more particularly, to a clocking scheme for allowing a contiguous memory array to be used to read and write various width data words from a memory array.

BACKGROUND OF THE INVENTION

A first-in first-out(FIFO) buffer reads various size data words from a memory array and writes various size data words to a memory array. In previous approaches a shift register scheme is generally required to generate a number of intermediate signals necessary to read or write a fixed data word width into the memory array. To implement a clocking scheme that retrieves fixed width data words that are equal to the width of the individual cells in the FIFO memory array, a 16-bit shift register would be required. To extend the previous approach to a memory array that is twice as wide as the width of the output data word, a 32-bit shift register would be required. Specifically, a 32-bit shift register would be necessary for a 9-bit word design and a 16-bit shift register would be required for a 18-bit word design. Previous approaches did not allow a single shift register to be used for both the 9-bit and 18-bit devices. Previous approaches for implementing FIFOs used a "carousel" type data retrieval scheme that used a 16-bit shift register to directly control each of the section control signals. To extend the previous approach systems to read both a 9-bit and 18-bit word would require a 32-bit shift register. The implementation of a 32-bit shift register would cause extreme difficulty in routing the various signals to appropriately connect the outputs of the shift register to each of the section control blocks. The implementation of a 32-bit shift register would also consume more than twice the amount of chip area as compared to a 16-bit shift register. Similar shift register implementations would be required to write data to the memory array.

Referring to FIG. 1, one scheme 10 for reading multiple width digital words from a memory array is shown. The scheme 10 generally comprising a shift register 12, a set of sense amplifiers 14a, 14b, 14c and 14d and a set of memory arrays 16a, 16b, 16c and 16d. A single data output 18 represents an output that receives information presented from each of the sense amplifiers 14a–14d. The 16-bit shift register 12 presents one of a set of control inputs 20a, 20b, 20c and 20d to each of the sense amplifiers 14a–14d. When one of the control inputs 20a–20d are present at one of the sense amplifiers 14a–14d, the information presented to the data output 18 is received from the appropriate memory array 16a–16d. An individual control input 20a–20d is required for each of the memory arrays 16a–16d. As the number of memory arrays 16a–16d increases, the number of control inputs 20a–20d will also increase. Each of the control inputs 20a–20d need to be individually routed from the individual sense amplifiers 14a–14d to the shift register 12. The routing necessary to appropriately connect the control inputs 20a–20d between the shift register 12 and the sense amplifiers 14a–14d increases. To expand the shift register 12 to a 32-bit shift register would require twice the amount of routing as well as an increased amount of chip real estate. The increase in routing the control inputs 20a–20d and the increased chip area makes the previous scheme difficult to implement with multiple width data words. This problem is further discussed in co-pending application Ser. No. 08/584,530, hereby incorporated by reference in its entirety.

Referring to FIG. 2, a scheme 22 for writing multiple width digital words to a memory array is shown generally comprising a shift register 24, a set of multiplexers 26a, 26b, 26c and 26d and a set of memory arrays 28a, 28b, 28c and 28d. A single data input 30 presents an input to each of the multiplexers 26a–26d. The 16-bit shift register 24 presents one of a set of control inputs 32a, 32b, 32c and 32d to each of the multiplexers 26a–26d. When one of the control inputs 32a–32d is present at one of the multiplexers 26a–26d, the data input 30 is received and is written to the appropriate one of the memory arrays 28a–28d. Individual control inputs 32a–32d are required for each memory array 28a–28d. As the number of memory arrays 28a–28d increases, the number of control inputs 32a–32d will also increase. Each of the control inputs 32a–32d would need to be individually routed from the individual multiplexers 26a–26d to the shift register 24. The routing necessary to appropriately connect the control inputs 32a–32d between the shift register 24 and the multiplexers 26a–26d increases. To expand the shift register 24 to a 32-bit shift register would require twice the amount of routing as well as an increased amount of chip real estate. The increase in routing the control inputs 32a–32d and the increased chip area makes the previous approach difficult to implement with multiple width data words. This problem is also addressed in co-pending application Ser. No. 08/559,983, hereby incorporated by reference in its entirety.

It is desirable to receive a particular size data word from the data input 30, write the word into the memory array 28a–28d, read a different size data word from the memory array 28a–28d and then present the different sized word to the data output 18. The schemes 10 and 22 do not contemplate this multiple size word writing and reading. In particular, the chip real estate problems inherent in implementing the shift register 12 and the shift register 24 would be magnified when implementing a system that writes in a particular size digital word and reads out a different size digital word. Additionally, logic would be necessary to synchronize the writing and reading from the memory arrays 16a–16c or the memory arrays 28a–28d. It should be noted that the memory arrays 16a–16c in FIG. 1 would correspond to the memory arrays 28a–28d in FIG. 2 for a system that writes and reads different sized words.

SUMMARY OF THE INVENTION

The present invention provides a clocking scheme for receiving a particular sized data word from a common input, writing the word to a number of individual memory cells in a memory array, reading another particular sized data word from the individual memory cells and then presenting the data word to a common output. The size of the word written to the memory cells can be larger, smaller or the same as the size of the word read from the memory array. The present invention uses a multi-bit write counter to distribute a write timing signal to a number of multiplexer blocks and a multi-bit read counter to distribute a read timing signal to a number of sense amplifier blocks. Each of the multiplexer blocks receives both a data input signal from the common input and the write timing signal at all times. When a particular write timing signal is present at the multiplexer, the fixed width data input is presented to the corresponding memory array. Each of the sense amplifier blocks reads data from the memory array and receives a read timing signal at all times. When a particular read timing signal is present at a sense amplifier, the output signal containing a fixed width data word is read from one or more of the corresponding memory arrays and is presented to the common output. The present invention reduces the number of internal signal lines necessary to implement the control function and allows for easy modification to both read and write multiple width words from the memory array.

The objects, features and advantages of the present invention include providing a control circuit for distributing data to a number of memory arrays from a common input, reading data from a number of memory arrays and presenting the data to a common output for use with both synchronous and asynchronous FIFOs as well as other memory devices. The present circuit produces the distributing and reading effects using a minimum number of signal lines and eliminates the need to use wide bit shift registers. Thus, the present invention consumes less overall chip real estate. The present circuit can also be very easily adapted to larger or smaller memory organization systems with minimum design changes and can easily be adapted to denser and wider memory devices with multiple data input and output word widths.

BRIEF DESCRIPTION OF THE DRAWINGS

These and other objects, features and advantages of the present invention will be apparent from the following detailed description and the appended claims in which:

DETAILED DESCRIPTION OF THE PREFERRED EMBODIMENTS

Figure 1:
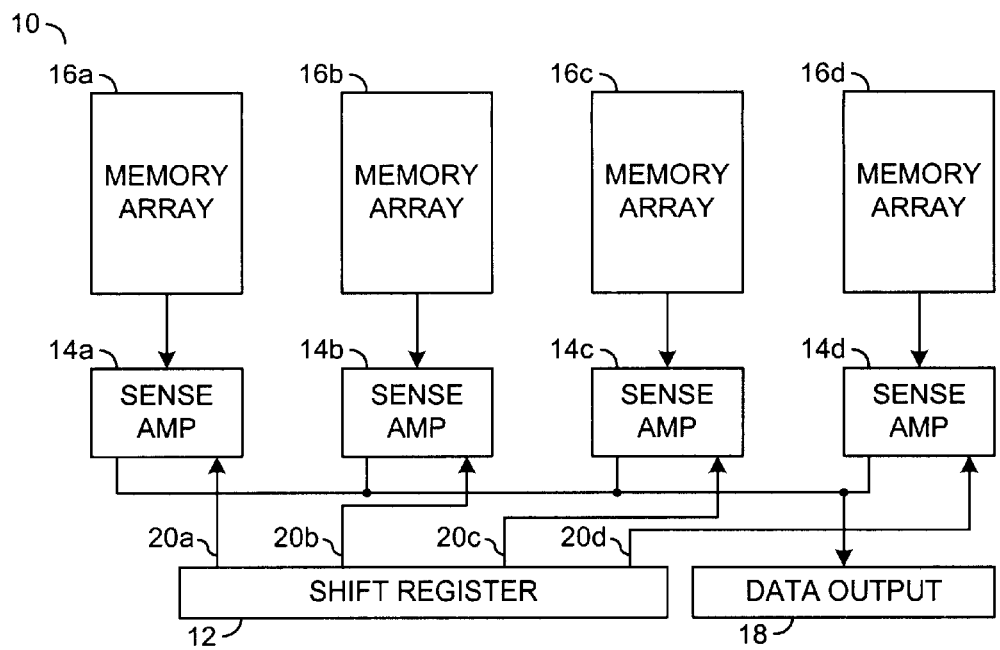
FIG. 1 is a block diagram of a reading scheme.
Figure 2:
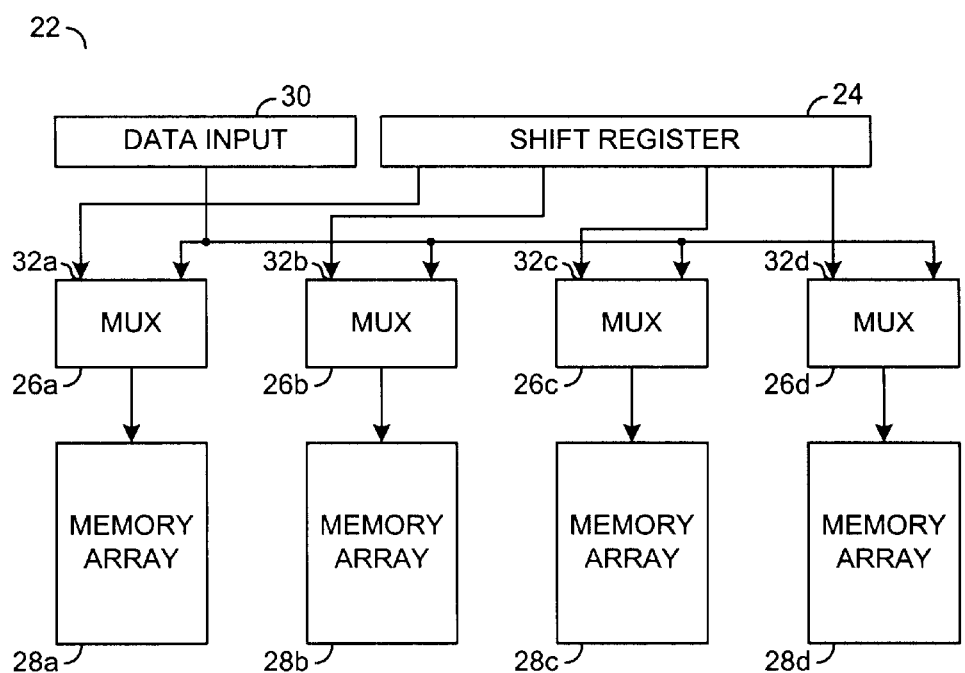
FIG. 2 is a block diagram of a writing scheme.
Figure 3:
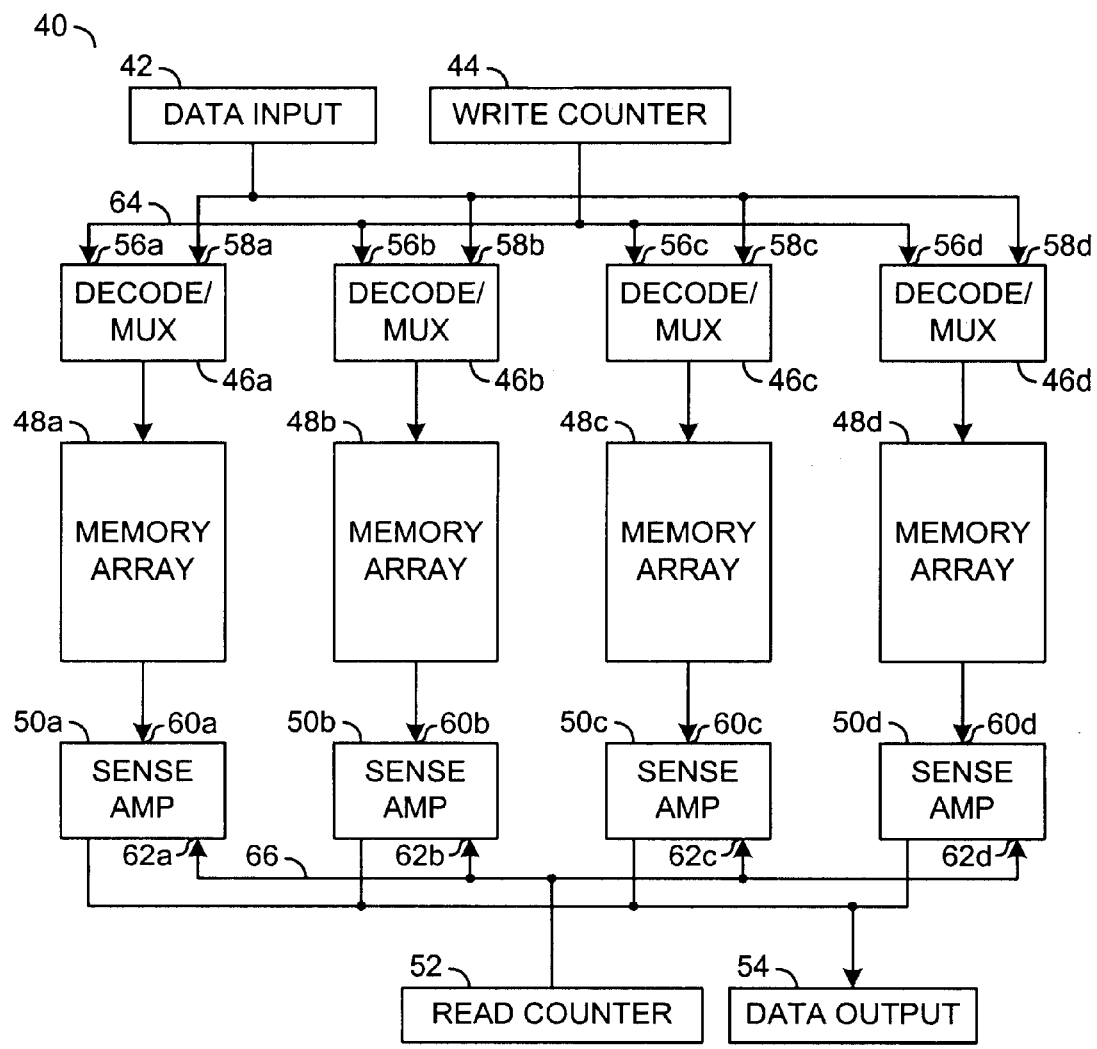
FIG. 3 is a block diagram of a preferred embodiment of a present invention.

Referring to FIG. 3, a block diagram of a clocking circuit 40 is shown in accordance with a preferred embodiment of the invention. The clocking circuit 40 generally comprises a data input 42, a write counter 44, a set of decoder and multiplexers 46a, 46b, 46c and 46d, a set of memory arrays 48a, 48b, 48c and 48d, a set of sense amplifiers 50a, 50b, 50c and 50d, a read counter 52, and a data output 54. The sense amplifiers 50a–50d, which act as output devices or means for outputting data, can also be implemented as latches or any other device that provides the equivalent function(s) of sensing and/or amplifying an electrical potential. Each of the decoder and multiplexers 46a–46d have a write timing input 56a–56d and a signal input 58a–58d. The decoder and multiplexers 46a–46d act as receiving devices which provide a means for receiving data and preferably sending the data to a memory device, such as a decoder, a decoder and multiplexer or other device(s) providing equivalent function(s). The write timing input 56a–56d of each of the decoder and multiplexers 46a–46d receive a write timing signal from the write counter 44 continuously when the circuit 40 is in operation. The signal input 58a–58d of each of the decoder and multiplexers 46a–46d receives a digital word from the data input 42 continuously when the circuit 40 is in operation. One or more the decoder and multiplexers 46a–46d will write a digital word to the corresponding memory array 48a–48d when a particular timing signal is received at the appropriate write timing input 56a–56d. The write timing input 56a–56d of each of the decoder and multiplexers 46a–46d is received through a write timing bus 64.

Each of the sense amplifiers 50a–50d has a signal input 60a–60d and a read timing input 62a–62d. Each of the sense amplifiers 50a–50d reads a digital word from the corresponding memory array 48a–48d continuously when the circuit 40 is in operation. Each of the read timing inputs 62a–62d of the sense amplifiers 50a–50d receive a read timing signal from the read counter 52 continuously when the circuit 40 is in operation. One or more of the sense amplifiers 50a–50d will present a signal to the data output 54 when an appropriate read timing signal is received at one of the read timing inputs 62a–62d. The read timing input 62a–62d of each of the sense amplifiers 50a–50d is received from the read counter 52 through a read timing bus 66.

While each of the decoder and multiplexers 46a–46d will receive the particular signal input 58a–58d continuously when the circuit 40 is in operation, only certain specific decoder and multiplexers 46a–46d will respond to the particular write timing signal received at the write timing inputs 56a–56d at any given time. The decoder and multiplexers 46a–46d that receive data from the signal inputs 58a–58d and present information to the corresponding memory arrays 48a–48d at a particular time are determined by a signal present at the write timing inputs 56a–56d. Each of the decoders and multiplexers 46a–46d receive the write timing signal at the write timing inputs 56a–56d continuously when the circuit 40 is in operation. The write counter 44 produces the write timing signal that is a unique multi-bit digital word that changes with each clock cycle. The write counter 44, when implemented as a 4-bit counter, produces a 4-bit digital word that produces $2^4$, or 16, unique states. A 5-bit write counter 44 produces a 5-bit digital word that produces $2^5$, or 32, unique states. As a result, the addition of a single bit to the write counter 44 and the timing bus 64 doubles the capabilities of the write portion of the clocking circuit 40. Each unique state produced by the write counter 44 provides a specific write timing signal that only certain specific decoder and multiplexers 46a–46d will recognize.

Each of the sense amplifiers 50a–50d receive the read timing signal at the read timing inputs 62a–62d continuously when the circuit 40 is in operation. Similar to the decoder and multiplexers 46a–46d, the sense amplifiers 50a–50d will receive the signal input 60a–60d continuously when the circuit 40 is in operation. Only certain specific sense amplifiers 50a–50d will respond to a specific read timing signal at any given time. The sense amplifier 50a–50d that reads data from the signal input 60a–60d from the corresponding memory array 48a–48d and presents it to the data output 54 is determined by read timing signal present at the read timing input 62a–62d. The read timing inputs 62a–62d receive the read timing signals from the read counter 52 through the read timing bus 66. Each of the sense amplifiers 50a–50d receive the read timing signal at the read timing input 62a–62d continuously when the circuit 40 is in operation. The read counter 52 produces the read timing signal that is a unique multi-bit digital word that changes with each clock cycle. The read counter 52, when implemented as a 4-bit counter, produces the read timing signal that is a 4-bit digital word that produces $2^4$, or 16, unique states. A 5-bit read counter 52 produces a 5-bit digital word that produces $2^5$, or 32, unique states. As a result, the addition of a single bit to the read counter 52 and the read timing bus 66 doubles the capabilities of the read portion of the clocking circuit 40. Only certain specific sense amplifiers 50a–50d will respond to a specific read timing signal produced by the read counter 52.

A specific example of a particular implementation of the present invention will be described where the memory arrays 48a–48d are 9-bit wide devices, the data input 42 is a stream of 9-bit digital words, and the data output 54 is a stream of 18-bit digital words. A first word is received by the decoder and multiplexer 46a from the data input 42 and written to the memory array 48a. The decoder and multiplexers 46b, 46c and 46d connected to the memory arrays 48b, 48c and 48d have a write timing signal present at the timing inputs 56b, 56c and 56d and a stream of digital words present at the signal inputs 58b, 58c and 58d, but do not write the digital word to the memory arrays 48b, 48c and 48d. When the first digital word is completely loaded through the decoder and multiplexer 46a and written to the memory array 48a, the write timing signal will continue to be recognized at the signal input 56a. The timing signal will then change and be recognized at the signal input 56b. At this point a second digital word received from the data input 42 will be loaded through the decoder and multiplexer 46b and written to the memory array 48b. The decoder and multiplexers 46a, 46c and 46d will not write the next digital word to the memory arrays 48a, 48c and 48d during this time. A similar word writing is accomplished when the decoder and multiplexer 46c and 46d write data words to the memory arrays 48c and 48d.

In order to read a stream of 18-bit digital words from the memory arrays 48a–48d, two of the sense amplifiers 50a–50d will simultaneously recognize a particular read timing signal present at the read timing input 62a–62d. For example, the sense amplifiers 50a and 50b may recognize a particular read timing input on a first clock cycle. This will allow an 18-bit word to be presented at the data output 54. On the next timing cycle, the sense amplifiers 50c and 50d will each read a 9-bit half of the next 18-bit digital word that is presented to the data output 54. On the next clock cycle, the sense amplifiers 50a and 50b will again be activated. It should be noted that the paring of the sense amplifiers 50a–50d can be modified to fit the design criteria of a particular application. For example, the first 18-bit digital word can be read from sense amplifier 50a and 50c, while the next 18-bit digital word may be read from the sense amplifiers 50b and 50d. Any such paring may be implemented.

It should be noted that each of the memory arrays 48a, 48b, 48c and 48d have a corresponding sense amplifier 50a, 50b, 50c and 50d. Each of the sense amplifiers 50a–50d recognize only a specific multi-bit read timing signal present at the read timing inputs 62a–62d. Only particular specified sense amplifiers 50a–50d recognizes the specific multi-bit timing word at any given clock cycle and processes the digital word present at the particular signal input 60a–60d. Effectively, each of the sense amplifiers 50a–50d act as a digital valve. The digital valve effect of the sense amplifiers 50a–50d effectively opens when the proper multi-bit timing word is present at a particular read timing input 62a–62d, reading from the appropriate memory array 48a–48d and presenting the information to the data output 54. Each of the sense amplifiers 50a–50d works in combination to completely load a digital word from one of the memory arrays 48a–48d on a given clock cycle before the next digital word from the next memory array 48a–48d is loaded into the data output 54 at the next clock cycle. The order that the digital words are received from the memory arrays 48a–48d can be any order necessary to fit the design criteria of a particular application.

The example illustrated using the 9-bit memory arrays 48a–48d and the 9-bit digital words as the data input 42 has a one word per timing signal relationship for the write portion of the clocking circuit 40. The read portion illustrated, where a 18-bit word is read from a series of 9-bit memory arrays 48a–48d has a two word per timing signal relationship, or a double word width. In an application where the width of the digital word is a multiple of the width of the memory arrays 48a–48d, each fraction (i.e. one half, one third, one fourth, etc.) of the digital word would be read from a separate one of the memory arrays 48a–48d on each clock cycle. As a result, the present invention would read a multi-width digital word from the memory arrays 48a–4d wherein multiple sense amplifiers 50a–50d respond to a particular read timing signal.

It is generally advantageous for a manufacturer to produce the smallest number of components necessary to maintain all product lines in current production. As a result, from a practical aspect, the present invention would be implemented using a write counter 44 and a read counter 52 that is five-bits wide for all applications that require either 16 unique states or 32 unique states. If only 16 unique states are required for a particular design application, only four of the bits on the write counter 44 or the read counter 52 would be used with one of the bits being disabled. For example, the most significant bit would be disabled if the write counter 44 or the read counter 52 were implemented as an up counter. Other counters could be used that produce a unique state at each clock cycle, such as a random counter. The approach of providing additional bits in the write counter 44 or the read counter 52 is practical since the addition of an additional counter bit and counter output signal line would be less expensive than producing two separate parts. This is in contrast to the previous approaches where two or more 32-bit shift registers are far more difficult to manufacture than two or more 16-bit shift registers. To maintain a single component using previous techniques, the much more complex 32-bit shift registers would have to be produced on each device, even if only a 16-bit shift register portion is actually used.

Figure 4:
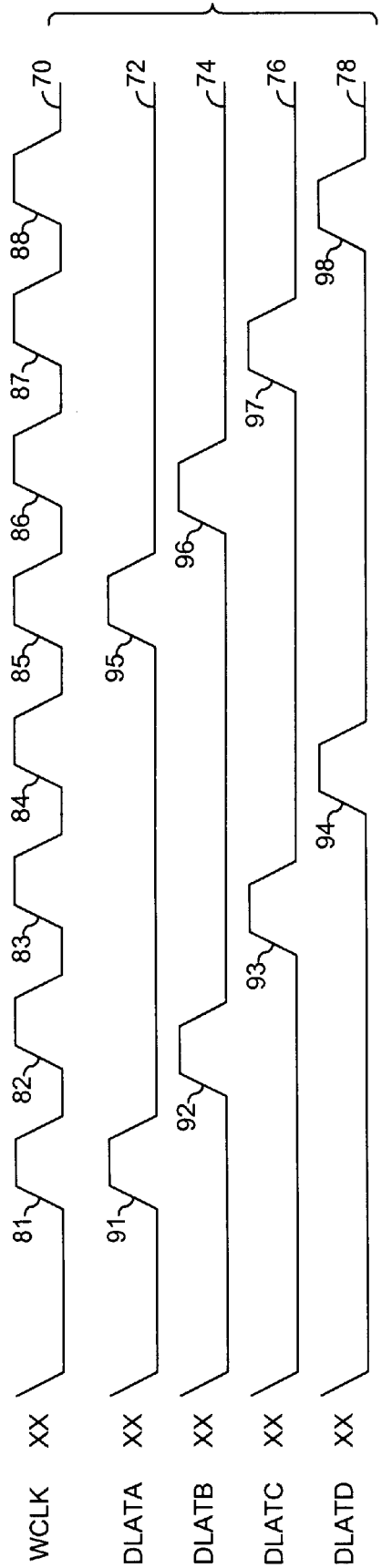
FIG. 4 is a timing diagram illustrating the effects of the present invention using a 9-bit data word.

Referring to FIG. 4, a timing diagram illustrating the functioning of the present invention when operating with a series of 9-bit data words as an input is shown. It should be appreciated that the example illustrated in FIG. 4 uses a 9-bit digital word for illustrative purposes only. Any fixed width digital word, including a single bit word, can be used without departing from the spirit of the invention. FIG. 4 generally comprises a WCLK clock 70, a dlatA signal 72, a dlatB signal 74, a dlatC signal 76 and a dlatD signal 78. The dlatA, dlatB, dlatC and dlatD signals 70, 72, 74, 76 and 78 provide pulses that represent when a word is written to a corresponding memory array 48a–48d. The digital high portions of the WCLK clock 70 are shown as pulses 81, 82, 83, 84, 85, 86, 87 and 88.

When the WCLK clock 70 is high at pulse 81, the dlatA signal 72 is shown as being high at a pulse 91. This writes a full 9-bit digital word to the memory array 48a. When the WCLK clock 70 is high at the pulse 82, the dlatB signal 74 is shown as being high at pulse 92. When the WCLK clock 70 is shown as being high at the pulse 83, the dlatC signal 76 is shown as being high at a pulse 93. Similarly, when the WCLK clock 70 is shown as being high at the pulse 84, the dlatD signal 78 is shown as being high at a pulse 94. The pulses 91, 92, 93 and 94 represent the writing of a 9-bit digital word to a respective one of the memory arrays 48a, 48b, 48c and 48d. After the dlatD signal 78 writes a word shown as the pulse 94, the next data word is written to the memory array 48a when the dlatA signal 72 is high at a pulse 95. A similar effect is shown with a pulse 96, a pulse 97 and a pulse 98. A direct relationship is shown where a single word is written to the memory array 48a, then a single digital word is written to the memory array 48b, then a single digital word is written to the memory array 48c and finally a single digital word is written to the memory array 48d. After the digital word is written to the memory array 48d, the process starts again with writing a digital word to the memory array 48a. The sequential writing of the memory arrays 48a, then 48b, then 48c, is for illustrative purposes only.

It should be appreciated that the number of memory arrays 48a–48d is shown to be four for illustrative purposes only. The number of memory arrays 48a–48d can be extended to any number of memory arrays desired for a particular design application or can be reduced to a single memory array. Increasing or decreasing the number of memory arrays 48a–48d would only require replacing the write counter 44 with a counter having a sufficiently wide bit path to provide a sufficient number of independent states to accommodate the number of words written to the number of memory arrays 48a–48d that are implemented. The width of the bit path would be determined by the width of the digital word, the width and number of the memory arrays 48a–48d and the desired order of the writing of the memory arrays 48a–48d. To accommodate these adjustments, the width of the bit path may have to be increased, decreased or left unchanged. The order of the writing to the memory arrays 48a–48d can be any order necessary to fit the design criteria of a particular application. The sequential writing to the memory array 48a, then 48b, then 48c, etc., is for illustrative purposes only. The order of which memory arrays 48a14d are written to can be adjusted to fit the design criteria of a particular application by programming the decoders and multiplexers 46a14d to respond to a timing signal that produces a non-sequential writing of the memory arrays 48a14d.

Figure 5:
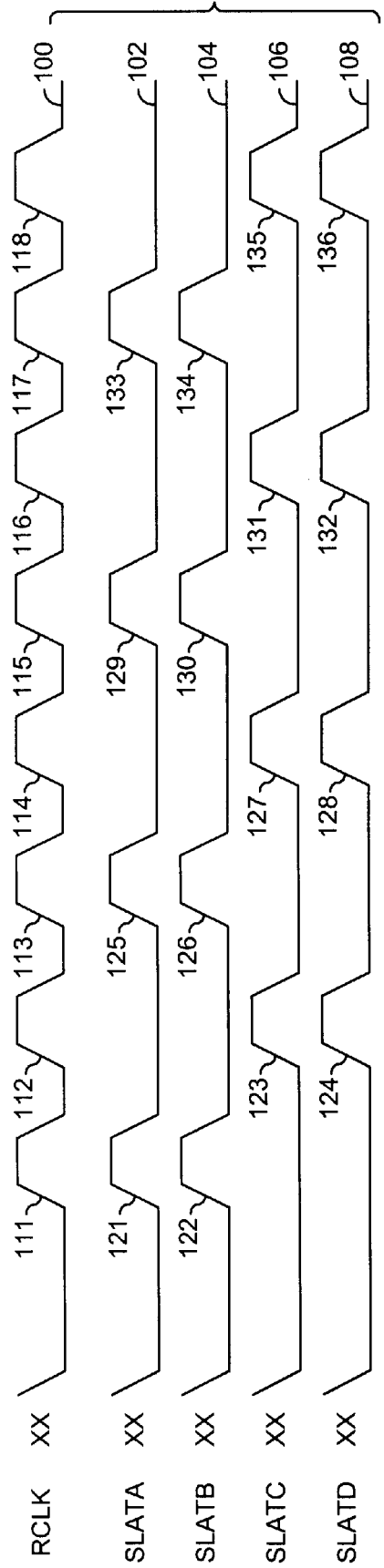
FIG. 5 is a timing diagram illustrating an implementation of the present invention using an 18-bit data word.

Referring to FIG. 5, an 18-bit data word width implementation of the read portion of the present invention is illustrated. It should be appreciated that an 18-bit digital word is read from the memory arrays 48a–48d while a 9-bit digital word is written into the memory arrays 48a–48d. Other word widths can be implemented at either the data input 42 or the data output 54 to fit the design criteria of a particular application. The 18-bit data word is considered a double width digital word as compared to the width of the memory arrays 48a–48d. Any multiple of the width of the memory arrays 48a–48d can be used. FIG. 5 generally comprises a RCLK clock 100, a slatA signal 102, a slatB signal 104, a slatC signal 106 and a slatD signal 108. The data word is 18-bits wide and the individual memory arrays 48a–48d are 9-bits wide. The 18-bit digital word is comprised of a number of fractional portions read from two of the memory arrays 48a–48d. The digital high portions of the RCLK clock 100 are shown as pulses 111, 112, 113, 114, 115, 116, 117 and 118.

When the RCLK clock 100 is high at the pulse 111, a first fraction, or half, of a 18-bit digital word is read from the memory array 48a and is shown as a pulse 121 on the slatA signal 102. A second fraction, or half, of the 18-bit digital word is read from the memory array 48b and is shown as the slatB signal 104 as a pulse 122. When the RCLK clock 100 is high at the pulse 112, a first fraction, or half, of the next 18-bit digital word is read from the memory array 48c as shown on the slatC signal 106 as a pulse 123. The second fraction, or half, of the next 18-bit digital word is read from the memory array 48d as shown on the slatD signal 108 at a pulse 124. When the RCLK clock 100 is high at the pulse 113, a first fraction, or half, of the next 18-bit digital word is read from the memory array 48a as shown as pulse 125 of the slatA signal 102. A second fraction, or half, of the next 18-bit digital word is read from the memory array 48b as shown by the pulse 126 on the slatB signal 104. A series of pulses 127, 128, 129, 130, 131, 132, 133, 134, 135 and 136 show similar reading of 18-bit digital words between either the slatA signal 102 and slatB signal 104 or the slatC signal 106 and the slatD signal 108. Each of the pulses 121–136 illustrates a 9-bit half of an 18-bit digital word read from one of the 9-bit wide memory arrays 48a–48d. The order of which memory arrays 48a–48d are read from can be adjusted to fit the design criteria of a particular application by programming the sense amplifiers 50a–50d to respond to a timing signal that produces a non-sequential reading of the memory arrays 48a–48d.

The example of the present invention illustrated in FIGS. 4 and 5 can be extended to reading and writing larger or smaller width digital words. While the FIG. 5 illustration was limited to reading a double width digital word, a triple, quadruple or other width digital word could be accomplished by extending the plurality of fractional portions of the digital word accordingly. The clocking circuit 40 can be programmed to read any multiple width digital word or write any multiple width digital word. The clocking circuit 40, for example, may be used to receive 18-bit words from the data input 42 and then 9-bit words to the data output 54. Additionally, the width of the memory arrays can be a fractional portion of the smallest word either written to or read from the memory arrays 48a–48d. If a 8-bit word is written to the memory arrays 48a–48d and a 16-bit word is read from the memory arrays 48a–48d, the memory arrays can be 4-bits wide. A combination of a first memory array, (e.g., memory array 48a) being 3-bits wide and a second memory array, (e.g., memory array 48b) being 5-bits wide will work as well. In other words, the width of the memory arrays 48a–48d do not have to be equal fractional portions of the smallest word widths. The programming of how the memory array is written to and read from can be programmed either during production of the clocking circuit 40, after production by using an external device to program the clocking circuit 40 or by any other programming scheme contemplated. Larger or smaller width memory arrays 48a–48d could also be accommodated. Also, a larger or smaller number of memory arrays 48a–48d could also be included. In any of the above modifications, the size of the write and read counters 44 and 52 would have to be adjusted accordingly. This adjustment would be minor since the addition of a single bit to the counter 34 doubles the number of possible independent states.

The present invention may be implemented as a data interface between systems which exchange data of the same or different bit sizes at the same or different rate. Such systems may include, but are not limited to, networking hardware, a modem, a facsimile machine, a disk drive buffer, a peripheral-computer interface, etc.

While the invention has been particularly shown and described with reference to the preferred embodiment thereof, it will be understood by those skilled in the art that various changes in form and details may be made without departing from the spirit and scope of the invention.

What is claimed is:

1. A circuit for reading and writing data to a number of memories comprising:
   a plurality of receiving devices each receiving: (i) one or more fixed width digital words and (ii) a write timing signal, at least one of said plurality of receiving devices presenting an output in an order defined by said write timing signal;

first counter circuit configured to provide said write timing signal changing to a different value on each cycle of a first clock;

a plurality of memory devices for storing information, wherein each of said memory devices is configured to (i) receive an input from said plurality of receiving devices in an order defined by said write timing signal and (ii) present an output in an order defined by a read timing signal;

second counter circuit configured to provide for said read timing signal changing to a different value on each cycle of a second clock input; and a plurality of output devices receiving said memory device outputs and said read timing signal, at least one of said output devices forms a multiple-width word by presenting one of said output(s) of said receiving devices when said read timing signal is present.

2. The circuit according to claim 1 wherein each of said memory devices comprises a fixed width memory array.

3. The circuit according to claim 1 wherein each of said memory devices comprises a fixed width memory array having a width equal to the fixed width of said fixed width digital words.

4. The circuit according to claim 1 wherein each of said memory devices comprises a fixed width memory array having a width less than the fixed width of said fixed width digital words.

5. The circuit according to claim 1 wherein each of said memory devices comprises a fixed width memory array having a width greater than the width of said fixed width digital words.

6. The circuit according to claim 1 wherein each of said fixed width digital words has a plurality of fractional portions, each of said memory arrays presenting and receiving said fractional portions.

7. The circuit according to claim 1 wherein each of said receiving devices comprises a decoder.

8. The circuit according to claim 1 wherein said memory device output is programmable between various sized multiple width digital words.

9. The circuit according to claim 1 wherein said memory device input is programmable between various sized multiple width digital words.

10. A circuit according to claim 1 wherein said memory devices each have one of a plurality of widths.

11. The circuit according to claim 10 wherein each of said fixed width digital words has a plurality of fractional portions, each of said memory devices presenting one or more of said fractional portions.

12. The circuit according to claim 10 wherein each of said receiving devices comprises a decoder.

13. The circuit according to claim 10 wherein said memory device output is programmable between various sized multiple width digital words.

14. The circuit according to claim 10 wherein said memory device input is programmable between various sized multiple width digital words.

15. A method of transferring data comprising:

(a) presenting an input signal comprising (i) a stream of fixed width digital words and (ii) a write timing signal comprising a first multi-bit digital word which changes to a different unique value on each cycle of a first clock, to a plurality of means for receiving said input signal;

(b) sending data in an order defined by said write timing signal to a plurality of means for storing information;

(c) sending data from said means for storing information to a plurality of means for detecting a change in electric potential;

(d) providing a read timing signal comprising a second multi-bit digital word which changes to a different unique value on each cycle of a second clock, to said plurality of means for detecting a change in electric potential; and (e) outputting data in an order defined by said read timing signal from said plurality of means for detecting a change in electrical potential.

\* \* \* \* \*